United States Patent
Kim et al.

(10) Patent No.: US 7,588,989 B2
(45) Date of Patent: Sep. 15, 2009

(54) DIELECTRIC MULTILAYER STRUCTURES OF MICROELECTRONIC DEVICES AND METHODS FOR FABRICATING THE SAME

(75) Inventors: Jong-Pyo Kim, Gyeonggi-do (KR); Jong-Ho Lee, Gyeonggi-do (KR); Hyung-Suk Jung, Gyeonggi-do (KR); Jung-Hyoung Lee, Gyeonggi-do (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 395 days.

(21) Appl. No.: 11/226,053

(22) Filed: Sep. 13, 2005

(65) Prior Publication Data

US 2006/0054980 A1 Mar. 16, 2006

Related U.S. Application Data

(63) Continuation-in-part of application No. 11/027,256, filed on Dec. 30, 2004, now Pat. No. 7,371,633, which is a continuation-in-part of application No. 09/776,059, filed on Feb. 2, 2001, now Pat. No. 6,844,604.

(30) Foreign Application Priority Data

Sep. 13, 2004 (KR) .................. 10-2004-0073078

(51) Int. Cl.
*H01L 21/336* (2006.01)
(52) U.S. Cl. .................. 438/287; 438/216; 438/261; 438/591; 257/E21.625

(58) Field of Classification Search ............... 438/3, 438/240, 261, 216, 287, 591; 257/E21.625, 257/E21.639, E21.679, E21.686
See application file for complete search history.

(56) References Cited

U.S. PATENT DOCUMENTS

| 2001/0015453 | A1 | 8/2001 | Agarwal | |
|---|---|---|---|---|
| 2001/0023120 | A1* | 9/2001 | Tsunashima et al. | 438/585 |
| 2002/0146895 | A1* | 10/2002 | Ramdani et al. | 438/497 |
| 2006/0138508 | A1* | 6/2006 | Shimizu et al. | 257/295 |

FOREIGN PATENT DOCUMENTS

| JP | 2004-79931 | 3/2004 |
|---|---|---|
| KR | 10-2004-0018225 | 3/2004 |
| KR | 2004-39979 | 5/2004 |

OTHER PUBLICATIONS

English language abstract of Korean Publication No. 2004-39979.
English language abstract of Japanese Publication No. 2004-79931.

\* cited by examiner

*Primary Examiner*—Thanhha Pham
(74) *Attorney, Agent, or Firm*—Marger Johnson & McCollom, P.C.

(57) ABSTRACT

A dielectric multilayer structure of a microelectronic device, in which a leakage current characteristic and a dielectric constant are improved, is provided in an embodiment. The dielectric multilayer structure includes a lower dielectric layer, which is made of amorphous silicate ($M_{1-x}Si_xO_y$) or amorphous silicate nitride ($M_{1-x}Si_xO_yN_z$), and an upper dielectric layer which is formed on top of the lower dielectric layer and which is made of amorphous metal oxide ($M'O_y$) or amorphous metal oxynitride ($M'O_yN_z$).

15 Claims, 4 Drawing Sheets

DIELECTRIC MULTILAYER STRUCTURES OF MICROELECTRONIC DEVICES AND METHODS FOR FABRICATING THE SAME

This application is a Continuation-In Part (CIP) of U.S. patent application Ser. No. 11/027,256 filed on Dec. 30, 2004, now U.S. Pat. No. 7,371,633, issued on May 13, 2008, which is a Continuation-In-Part (CIP) of U.S. patent application Ser. No. 09/776,059, filed on Feb. 2, 2001, now U.S. Pat. No. 6,844,604, issued on Jan. 18, 2005, all of which are incorporated herein by reference in their entirety. This patent application also claims priority from Korean Patent Application No. 10-2004-0073078, filed on Sep. 13, 2004 in the Korean Intellectual Property Office, the disclosure of which is incorporated herein by reference in its entirety.

BACKGROUND OF THE INVENTION

1. Field of the Invention

The present invention relates to microelectronic devices and methods for fabricating the same, and more particularly, to dielectric multilayer structures and methods for fabricating the same.

2. Description of the Related Art

Through the evolution of integrated circuit (IC) technology, sizes of microelectronic devices have become smaller, providing high integration density and high performance. Particularly, a gate dielectric layer is formed to be as thin as possible. This is because the thinner the thickness of the gate dielectric layer, the larger a driving current of a microelectronic device such as a MOS transistor. Thus, it becomes increasingly important to form a reliable gate dielectric layer, one that is extremely thin and has minimum defects, in order to improve the performance of microelectronic devices.

A thermal oxide layer, that is, a silicon oxide layer, has been used as the gate dielectric layer for several decades. This is because the silicon thermal oxide layer is stable with respect to the underlying silicon substrate, and a method for its fabrication is relatively simple.

However, since the silicon oxide layer has a low dielectric constant of about 3.9, reduction of the thickness of the gate dielectric layer made of the silicon oxide layer is limited. Also, it is difficult to reduce the thickness of the silicon oxide layer owing to a gate leakage current flowing through the gate dielectric layer made of the thin silicon oxide layer.

Accordingly, there has been increasing demand for a substitute dielectric layer, such as a metal oxide layer, which may be thicker than the silicon oxide layer, but can still improve the performance of a device, e.g., a high current drivability. The performance of the substitute dielectric layer can be evaluated and expressed by an equivalent oxide thickness (EOT).

Although a metal oxide layer has a greater thickness than that of the silicon oxide layer, the metal oxide layer can reduce the leakage current without adversely affecting the performance of the devices. Moreover, if the gate dielectric layer is thick, an etching margin of the gate dielectric layer can be increased while forming a gate electrode. The increase of the etching margin prevents the silicon substrate from being inadvertently exposed during an etching process for forming the gate electrode. For this reason, metal oxides of high dielectric constants have been suggested as an alternative for the dielectric material that forms the gate dielectric layer or that forms a capacitor dielectric layer. Since a dielectric constant of the metal oxide layer is higher than that of the silicon oxide layer, the metal oxide layer, which has an EOT equal to the silicon oxide layer while being physically thicker than the silicon oxide layer, can be used as the gate dielectric layer of a semiconductor device or as the capacitor dielectric layer. However, metal oxides such as BST, $TiO_2$, and $Ta_2O_5$ have several problems when a conventional substrate, e.g., the silicon substrate, is used. For example, the metal oxides such as BST, $TiO_2$, and $Ta_2O_5$ easily react with the silicon substrate, degrading the interface characteristic between the silicon substrate and the metal oxide layer. In particular, the leakage current is increased, an interface trap density is increased, and channel mobilities of carriers are decreased. As a result, the rate at which the current of a MOS transistor turns on or off is decreased so that the switching characteristic of the MOS transistor is significantly reduced.

On the other hand, an Aluminum oxide layer, a single metal oxide layer, is known to have excellent thermal stability. However, the Aluminum oxide layer cannot be used by itself because it has a low dielectric constant, i.e., about 9, and it is quite difficult to control a threshold voltage due to a negative fixed charge therein.

In contrast, a hafnium oxide ($HfO_2$) layer and a zirconium oxide ($ZrO_2$) layer, which also are single metal oxide layers, have a high dielectric constant of 20 or more and it is easy to fabricate them. However, the single metal oxide layers have a relatively low crystallization temperature and are thermally unstable. Thus, the single metal oxide layers can be easily crystallized if a subsequent thermal annealing process for activating impurities injected into a source/drain region is performed. Therefore, crystal grain boundaries are formed within the single metal oxide layers, resulting in current leakage.

A metal oxide layer of different elements, for example, a hafnium aluminum oxide ($HfAlO_x$) layer, which has been studied as an alternative for the metal oxide layer of the single metal oxide layer, has a relatively excellent leakage current characteristic and a low threshold voltage characteristic, thereby enabling stable fabrication of the $HfAlO_x$ layer. However, a mobility characteristic of the $HfAlO_x$ layer is low and the rate at which the current of a MOS transistor, for example, a pMOSFET, turns on or off ("switch characteristic") is reduced by the low mobility characteristic.

A hafnium silicate layer or a zirconium silicate layer, which are metal oxide layers of different elements, is formed on a silicon substrate in a chemically stable state so that an unnecessary interface layer that will increase the EOT as in the case of a silicon oxide layer is not formed. However, unfortunately, a threshold voltage of a MOS transistor, for example, a pMOSFET, is very large and it also is not easy to fabricate a pMOSFET. Further, the metal oxide layer of different elements has a dielectric constant of about 10-12 so that the amount that the dielectric constant of the pMOSFET may be increased is limited. Embodiments of the invention address these and other disadvantages of the conventional art.

SUMMARY

In one embodiment of the present invention, a dielectric multilayer structure comprises a lower dielectric layer and an upper dielectric layer. The lower dielectric layer may be made of amorphous silicate ($M_{1-x}Si_xO_y$) or amorphous silicate nitride ($M_{1-x}Si_xO_yN_z$). The upper dielectric layer may be formed on top of the lower dielectric layer and may be made of amorphous metal oxide (M'O$_y$) or amorphous metal oxynitride (M'O$_y$N$_z$).

BRIEF DESCRIPTION OF THE DRAWINGS

The above and other features and advantages of the present invention will become more apparent by describing in detail an exemplary embodiment thereof with reference to the attached drawings in which.

DETAILED DESCRIPTION

The present invention will now be described more fully with reference to the accompanying drawings, in which preferred embodiments of this invention are shown. Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

A dielectric layer according to some embodiments of the present invention is used in the fabrication of various microelectronic devices. The dielectric layer according to some embodiments of the present invention can be used as gate dielectric layers and intergate dielectric layers of a volatile memory device such as DRAM and SRAM or a nonvolatile memory device such as EEPROM and a flash memory device, a micro-electro mechanical system (MEMS) device, an optoelectronic device and a display device, or the like. The dielectric layer according to some embodiments of the present invention can be used for a capacitor dielectric layer. However, these are intended merely to be illustrative and in no way limiting the scope of the present invention.

Further, according to some embodiments of the present invention, a semiconductor substrate on which the dielectric layer includes, but not limited to, a silicon substrate, a silicon-on-insulator (SOI) substrate, a gallium (Ga)-arsenic (As) substrate, a silicon-germanium (Ge) substrate, a ceramic substrate, a quartz substrate, or the like. However, these are intended merely to be illustrative. Hereinafter, the explanations given will use as an example a silicon substrate, which is most commonly used.

The dielectric layers according to some embodiments of the present invention will be embodied as a dielectric multilayer structure in which a lower dielectric layer and an upper dielectric layer are stacked. The lower dielectric layer is kept in an amorphous state, which is suitable for improving an interface characteristic because there is no path for a leakage current in the amorphous state. The upper dielectric layer is suitable for increasing a dielectric constant and improving the performance of a microelectronic device. Preferred embodiments of the present invention will be better understood by referring to FIGS. 1 to 3.

Figure 1:
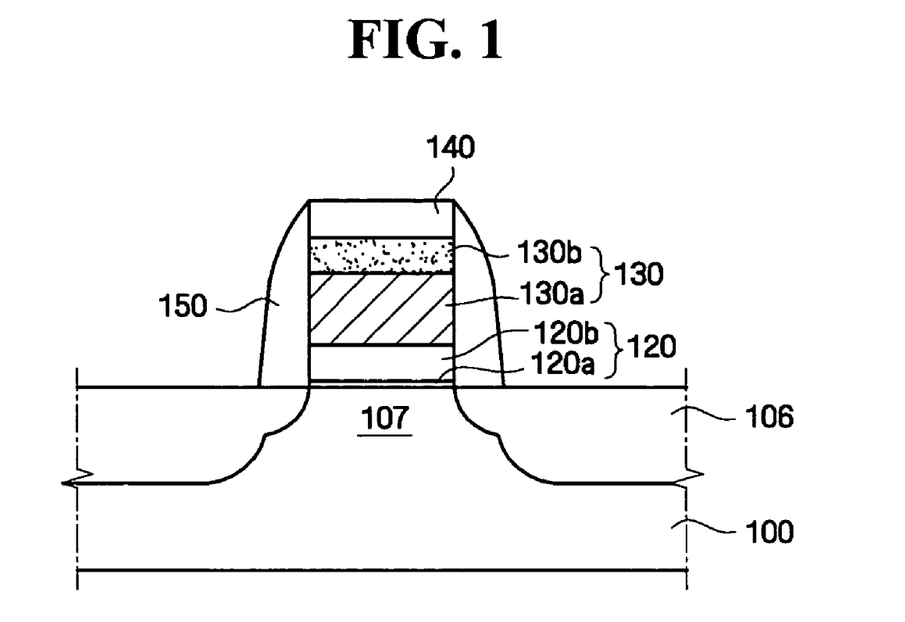
FIG. 1 is a cross-sectional view of a device according to an embodiment of the present invention.
Figure 2:
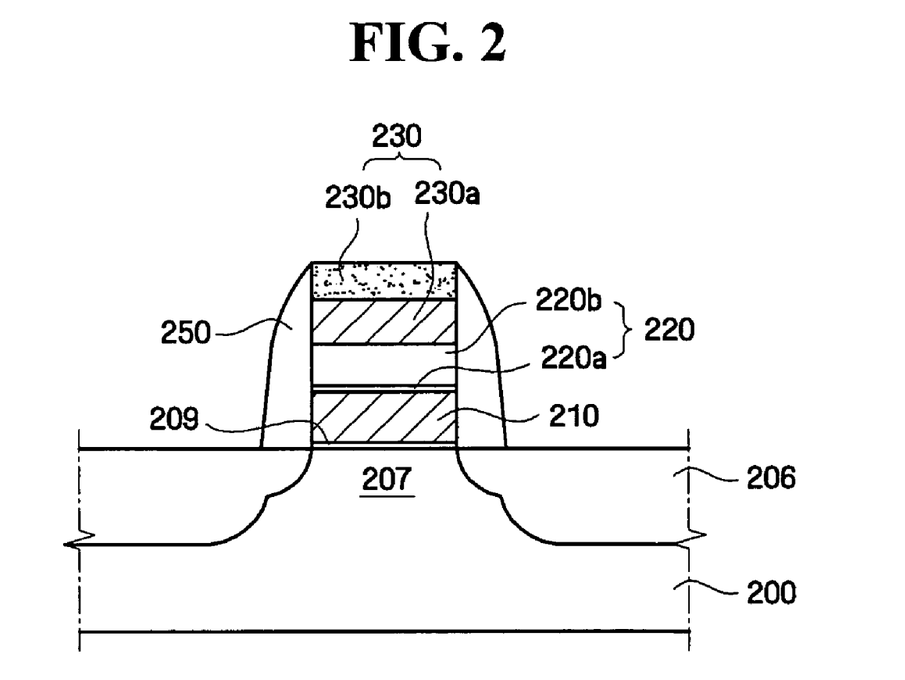
FIG. 2 is a cross-sectional view of a device according to another embodiment of the present invention.
Figure 3:
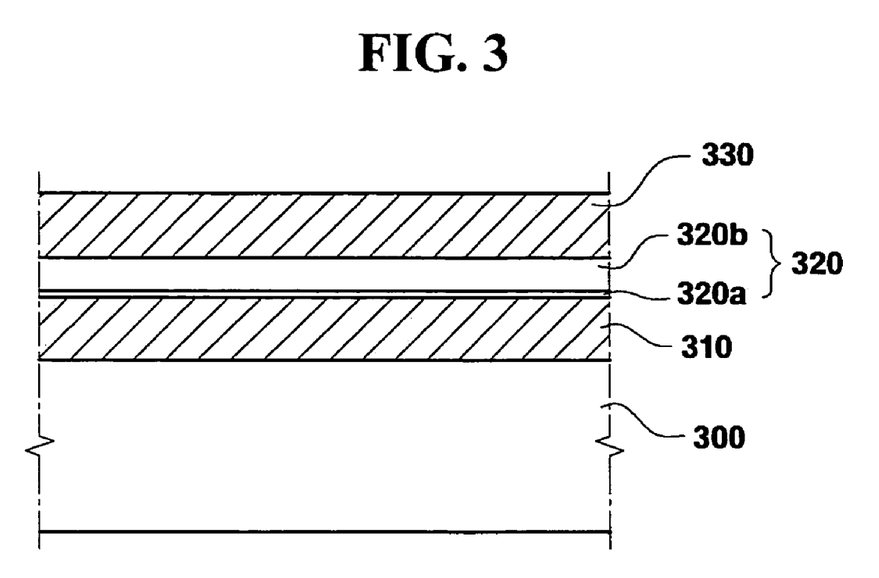
FIG. 3 is a cross-sectional view of a device according to a still another embodiment of the present invention.

FIGS. 1 to 3 are cross-sectional views of microelectronic devices including the dielectric layer, according to some embodiments of the present invention.

FIG. 1 is a cross-sectional view of a MOS transistor, FIG. 2 is a cross-sectional view of a flash memory cell transistor, and FIG. 3 is a cross-sectional view of a capacitor.

Referring to FIG. 1, a dielectric layer 120 according to an embodiment of the present invention is formed on top of a channel region 107 defined by a source/drain region 106 formed on a silicon substrate 100. A gate electrode 130 is formed on an upper part of the dielectric layer 120. The gate electrode 130 is made of a polysilicon layer 130a. Further, the gate electrode 130 may include the polysilicon layer 130a and a silicide layer 130b, which are sequentially stacked. A spacer 150 is formed on sidewalls of the dielectric layer 120 and the gate electrode 130. Selectively, a native oxide layer (SiO$_2$) (not shown) having a thickness of, perhaps, 4 Å or less, may be formed on a bottom portion of the dielectric layer 120. Alternatively, the native oxide layer may be removed, from the bottom portion of the dielectric layer 120.

Referring to FIG. 2, a stack gate structure including a floating gate 210 and a control gate 230 is formed over a channel region 207 defined by a source/drain region 206 formed on a silicon substrate 200. An intergate dielectric layer 220 according to an embodiment of the present invention is formed between the floating gate 210 and the control gate 230. Reference numeral 209 denotes a gate dielectric layer. The gate dielectric layer 209 may be formed using a conventional dielectric layer in FIG. 2. Alternatively, the gate dielectric layer 209 may be formed according to some embodiments of the present invention as in FIG. 1. The control gate 230 may be made of a polysilicon layer 230a and may include the polysilicon layer 230a and a silicide layer 230b, which are sequentially stacked. A spacer 250 may be formed on sidewalls of the control gate 230, the intergate dielectric layer 220, the floating gate 210 and the gate dielectric layer 209. A native oxide layer (SiO$_2$) (not shown) having a thickness of, perhaps, about 4 Å or less may be formed on a bottom portion of the gate dielectric layer 209. The native oxide layer may be removed.

Referring to FIG. 3, a dielectric layer 320, including a lower dielectric layer 320a, according to an embodiment of the present invention is formed between a lower electrode 310 and an upper electrode 330 over a silicon substrate 300.

The silicon substrates 100, 200 and 300 of FIGS. 1 to 3 may be a polished silicon substrate and a single crystal epitaxy substrate formed by epitaxial growth, or an SOI substrate. Examples of the capacitor of FIG. 3 include a metal-oxide silicon (MOS) capacitor, a pn-junction capacitor and a polysilicon-insulator-polysilicon (PIP) capacitor. The lower electrode 310 may be formed of single crystalline silicon or polycrystalline silicon. The dielectric layers 120, 220, and 320 according to embodiments of the present invention have a multi-layered structure, e.g., a double-layered structure including the lower dielectric layers 120a, 220a, and 320a and the upper dielectric layers 120b, 220b, and 320b.

The lower dielectric layers 120a, 220a and 320a are made of a material having a dielectric constant larger than those of silicon oxide, silicon nitride, and silicon oxynitride. Furthermore, the lower dielectric layers 120a, 220a, and 320a are made of a material having excellent coherency with the underlying structures such as the channel region 107, the floating gate 210, and the lower electrode 310, which are made of silicon, and a small interface trap density. The lower dielectric layers 120a, 220a, and 320a are made of a material whose amorphous state is retained in a subsequent annealing process. As a result, that crystal grain boundaries that enable current flow are not formed.

Thus, the lower dielectric layers 120a, 220a, and 320a may be made of amorphous $M_{1-x}Si_xO_y$ or amorphous $M_{1-x}Si_xO_yN_z$. At this time, M denotes a metal. M may be, for example, titanium (Ti), zirconium (Zr), hafnium (Hf), strontium (Sr), barium (Ba), scandium (Sc), yttrium (Y), lanthanum (La), tantalum (Ta), or aluminum (Al). However, the present invention is not limited to these metals and any material suitable for the present invention can be used without departing from the spirit and scope of the present invention.

The lower dielectric layers 120a, 220a, and 320a are silicate dielectric layers formed by forming a $MO_y$ layer or a $MO_yN_z$ layer, heat-treating the $MO_y$ layer or the $MO_yN_z$ layer, and reacting the heat-treated layer with the silicon that exists within the underlying structures such as the channel region 107, the floating gate 210, and the lower electrode 310. The thicknesses of the lower dielectric layers 120a, 220a, and 320a are equal to or below a critical crystallization thickness in which they can be kept in the amorphous state without being crystallized, even though thermal processes are performed. Thus, the thicknesses of the lower dielectric layers 120a, 220a, and 320a may be 20 Å or less. Preferably, the thicknesses of the lower dielectric layers 120a, 220a, and 320a may be 15 Å or less. A value of 1−x representing composition ratios of the lower dielectric layers 120a, 220a, and 320a may be in a range of 0.1-0.5. A value of 1−x may be in the range of about 0.2 to about 0.4 to indicate an optimum dielectric constant. However, the present invention can be practiced using the value other than 1−x.

A Si concentration within the lower dielectric layers 120a, 220a, and 320a may have an inclined distribution. The Si concentration may be higher in interfaces between the lower dielectric layers 120a, 220a, and 320a and the lower structures 107, 210, and 310.

The upper dielectric layers 120b, 220b, and 320b are made of a material with a high dielectric constant which can maximize the dielectric constants of the dielectric layers 120, 220, and 320. Further, the upper dielectric layers 120b, 220b, and 320b are made of a material which can be coherent with the lower dielectric layers 120a, 220a and 320a. Furthermore, the upper dielectric layers 120b, 220b, and 320b are made of a material which does not react with the overlying structures such as the gate electrode 130, the control gate 230, and the upper electrode 330. The upper dielectric layers 120b, 220b, and 320b are made of a material in which an amorphous state is retained in the subsequent annealing process, so that crystal grain boundaries that undesirably allow the flow of current are not formed.

Thus, the upper dielectric layers 120b, 220b, and 320b can be made of metal oxide ($M'O_y$) or metal oxynitride ($M'O_yN_z$) having a dielectric constant larger than that of the lower dielectric layers 120a, 220a and 320a. At this time, M' may be, for example, titanium (Ti), zirconium (Zr), hafnium (Hf), strontium (Sr), barium (Ba), scandium (Sc), yttrium (Y), lanthanum (La), tantalum (Ta), or aluminum (Al). However, the present invention is not limited to the above metals and any material suitable for the present invention can be used without departing from the spirit and scope of the present invention. Further, the upper dielectric layers 120b, 220b, and 320b may be made of oxide or oxynitride consisting of the same metal as the metal (M) forming the lower dielectric layers 120a, 220a, and 320a or a homologous metal (M') of the metal (M). As a result, the upper dielectric layers 120b, 220b, and 320b are coherent with electrical properties of the lower dielectric layers 120a, 220a, and 320a, thereby resulting in more stable dielectric layers 120, 220, and 320. The thicknesses of the upper dielectric layers 120b, 220b, and 320b are equal to or below a critical crystallization thickness in which they can be kept in the amorphous state without being crystallized, even though thermal processes are performed. Thus, the thicknesses of the upper dielectric layers 120b, 220b, and 320b may be 20 Å or less. Preferably, the thicknesses of the upper dielectric layers 120b, 220b, and 320b may be 15 Å or less.

On the other hand, the upper dielectric layers 120b, 220b, and 320b can contain a very small amount of Si diffused from the lower dielectric layers 120a, 220a, and 320a. Since Si may be diffused from the lower dielectric layers 120a, 220a, and 320a, as one moves further away from the lower surfaces of the lower dielectric layers 120a, 220a, and 320a, the Si concentration decreases.

Figure 4:
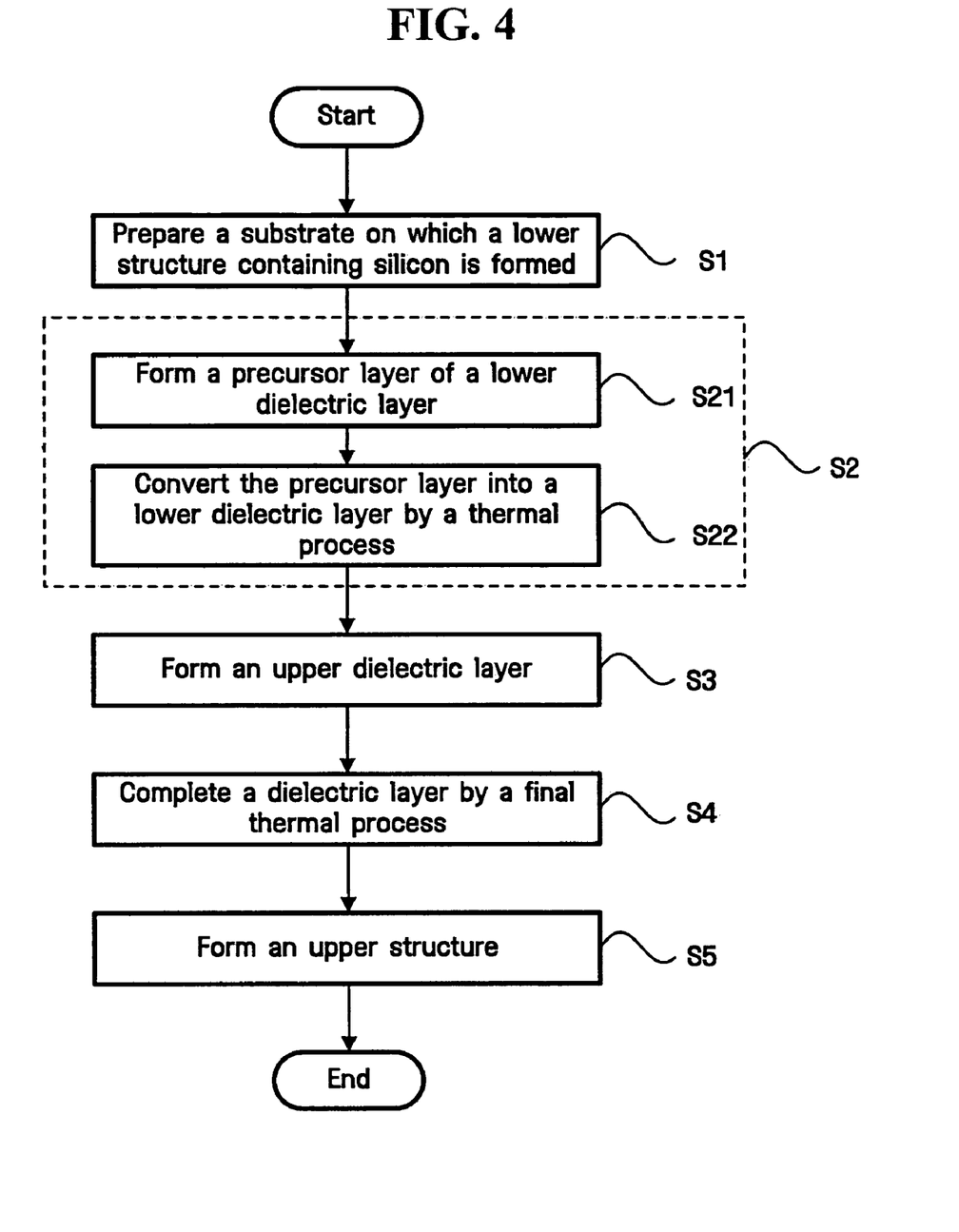
FIG. 4 is a flow-chart for fabricating the devices according to yet another embodiments of the present invention.
Figure 5:
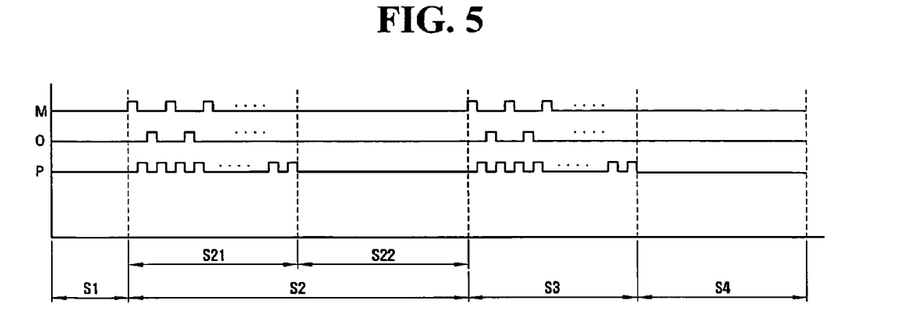
FIG. 5 is a supply timing diagram that shows when gases are supplied in each step of the fabricating method shown in FIG. 4.

Hereinafter, a method for fabricating the dielectric layers 120, 220 and 320 according to some embodiments of the present invention shown in FIGS. 1 to 3 is explained with reference to the flow chart of FIG. 4 and the supply timing diagram of FIG. 5 that shows when gases are supplied.

First, as shown in FIGS. 1 to 3, the substrates 100, 200, and 300, on which the underlying structures containing silicon, such as the channel region 107, the floating gate 210 and the lower electrode 310 are formed, are prepared in step S1.

Subsequently, the lower dielectric layers 120a, 220a, and 320a are formed over the lower structures in step S2.

First, precursor layers of the underlying dielectric layers are formed in step S21. $MO_y$ or $MO_yN_z$ is used for the precursor layers. The precursor layers are formed to have a thickness that is equal to or below the critical crystallization thickness in which they can be kept in an amorphous state without being crystallized, even though thermal processes are performed. Thus, the precursor layers are preferably formed to have a thickness of 20 Å or less.

More preferably, the precursor layers are formed to have a thickness of about 15 Å or less. At this time, M may be titanium (Ti), zirconium (Zr), hafnium (Hf), strontium (Sr), barium (Ba), scandium (Sc), yttrium (Y), lanthanum (La), tantalum (Ta), or aluminum (Al). Preferably, if the precursor layers are formed using an atomic layer deposition (ALD) method, it is possible to form the precursor layers at a low temperature. Furthermore, various precursors can be used and the thicknesses of the precursor layers can be precisely controlled by using the ALD method. The ALD method for forming the precursor layer, as shown in FIG. 5, can be carried out by repeatedly performing supply processes of a metal source (M), an oxygen source (O), and a purge gas (P), for example.

The precursor layers are formed to have a thickness of about 20 Å or less by repeatedly performing the above processes.

TABLE 1

|  | Hf | Zr |
|---|---|---|
| Halide | $HfCl_4$ | $ZrCl_4$ |
| Alkoxide | $Hf(OtC_4H_9)_4 Hf(OC_2H_5)_4$ | $Zr(OtC_4H_9)_4$ |
| Amide | $Hf(N(C_2H_5)_2)_4$ | $Zr(N(C_2H_5)_2)_4$ |
|  | $Hf(N(CH_3)_2)_4$ | $Zr(N(CH_3)_2)_4$ |
| Alkoxyamine | $Hf(dmae)_4$ | $Zr(dmae)_4$ |
| Others |  |  |

(dmae: dimethylamine)

H$_2$O, O$_3$, an O radical, alcohol (for example, isopropyl alcohol), D$_2$O, and H$_2$O$_2$ can be used as the oxygen source (O). In addition, other precursor layers suitable for the present invention can be used without departing from the spirit and scope of the present invention.

Of course, if it is possible to control the thickness of the precursor layer to a level similar to that obtained in the ALD method, a chemical vapor deposition (CVD) method, a metal organic chemical vapor deposition (MOCVD) method, or a reactive sputtering technology can be used instead of the ALD method. In the MOCVD method, Hf-t-butoxide can be used as an Hf source and Zr-t-butoxide can be used as a Zr source. Selectively, the process for removing the native oxide layer (SiO$_2$) (not shown) of a thickness of 4 Å or less, which is naturally formed on the substrate 100, 200 and 300, can be carried out before forming the lower dielectric layers 120a, 220a and 320a.

Subsequently, the precursor layer is heat-treated in step S22. The heat treatment can be carried out by a simple thermal process, a thermal nitridation process, a thermal oxidation process, or a combination thereof.

The simple thermal process can be performed at a temperature of about 600 to about 1,000° C. in an inert gas atmosphere or in a vacuum for about 30 to about 60 seconds. The inert gas may be Ar, He, N$_2$, D$_2$, H$_2$, or combinations thereof.

The thermal nitridation process can be performed at a temperature of about 600 to about 1,000° C. in a nitrogen atmosphere for about 30 to about 60 seconds. The thermal nitridation process may be a plasma nitridation process such as direct plasma nitridation, remote plasma nitridation, or NH$_3$ plasma nitridation. The thermal nitridation process may be a rapid thermal process (RTP) in an atmosphere of NH$_3$, NO, and N$_2$O.

The thermal oxidation process can be performed at a temperature of about 600 to about 1,000° C. in an oxygen atmosphere for about 30 to about 60 seconds. The thermal oxidation process may be a dry oxidation process using N$_2$O, NO, and O$_2$, an annealing process using O$_3$, an oxidation process using oxygen radicals, an oxidation process using O$_2$ plasma, a wet oxidation process using H$_2$O, a wet oxidation process using in-situ steam generation (ISSG), or a wet oxidation process using water vapor generation (WVG).

The RTP among the above-described thermal processes can be effectively used in some embodiments of the present invention. Specifically, a rapid thermal oxidation (RTO) process is performed after a rapid thermal nitridation (RTN) process. Alternatively, only the RTN process may be performed. Also, only a rapid thermal annealing (RTA) process may be performed. In addition, the RTA process may be performed after the RTN process. Further, the RTN, RTO, and RTA processes may be performed in this listed order. The RTO process is not performed first to prevent a silicon oxide layer from forming in the interfaces between each of the lower dielectric layers 120a, 220a, and 320a and each of the lower structures 107, 210, and 310.

The precursor layers are converted into the amorphous silicate (M$_{1-x}$Si$_x$O$_y$) layer or the amorphous silicate nitride (M$_{1-x}$Si$_x$O$_y$N$_z$) layer by the above-described thermal processes. The lower dielectric layers 120a, 220a, and 320a formed by the above-described processes have dielectric constants of about 10 to about 12, which are relatively high compared to the dielectric constants of the silicon oxide layer, the silicon nitride layer, and the silicon oxynitride layer. Thus, the EOT of the lower dielectric layers 120a, 220a, and 320a can be reduced below the EOT of the prior art. At this time, if the M$_{1-x}$Si$_x$O$_y$ layer or the M$_{1-x}$Si$_x$O$_y$N$_z$ layer is heat-treated to have a value of x in a range of about 0.1 to about 0.5, or preferably, in a range of about 0.2 to about 0.4, the dielectric constants of the lower dielectric layers 120a, 220a, and 320a can be optimized. Since the precursor layers are formed to have a thickness that is equal to or below the critical crystallization thickness, the lower dielectric layers 120a, 220a, and 320a can be kept in the amorphous state so that the leakage current path is not formed, even though the precursor layers are heat-treated. Further, although the subsequent thermal process for activating the source/drain region is performed at a high temperature of 900° C. or more, the amorphous state is maintained. Thus, since the amount of crystal grain formed is small, the leakage current can be reduced.

Subsequently, the upper dielectric layers 120b, 220b, and 320b are formed in step S3.

If the upper dielectric layers 120b, 220b, and 320b are formed on top of the lower dielectric layers 120a, 220a, and 320a using the metal oxide (M'O$_y$) layer or the metal oxynitride (M'O$_y$N$_z$) layer having a dielectric constant of 20 or more, dielectric constants of the dielectric layers 120, 220 and 320 can be increased so that the EOT can be reduced. M' may be titanium (Ti), zirconium (Zr), hafnium (Hf), strontium (Sr), barium (Ba), scandium (Sc), yttrium (Y), lanthanum (La), tantalum (Ta), or aluminum (Al). Further, if the upper dielectric layers 120b, 220b, and 320b are made of metal oxide including the same metal as the metal (M) forming the lower dielectric layers 120a, 220a, and 320a or the homologous metal (M') of the metal (M), the upper dielectric layers 120b, 220b, and 320b cohere with electrical properties of the lower dielectric layers 120a, 220a, and 320a so that the dielectric layers 120, 220, and 320 have a more stable structure. Thus, the upper dielectric layers 120b, 220b, and 320b can be made of the same material as the precursor layers of the lower dielectric layers 120a, 220a, and 320a. The upper dielectric layers 120b, 220b, and 320b can be formed at a low temperature and their thicknesses can be controlled precisely by using the ALD method as in the step (step S21 of FIG. 5) for forming the precursor layers of the lower dielectric layers 120a, 220a, and 320a. As shown in FIG. 5, step S3 for forming the upper dielectric layers 120b, 220b, and 320b can be carried out by repeatedly performing supply processes of the metal source (M), the purge gas (P), the oxygen source (O), and the purge gas (P). Although the subsequent thermal process is performed by repeatedly performing the above processes, the upper dielectric layers 120b, 220b and 320b are formed to have a thickness that is equal to or below the critical crystallization thickness in which their amorphous state can be maintained. For example, the upper dielectric layers 120b, 220b, and 320b are formed to be 20 Å or less, or preferably, 15 Å or less. If the upper dielectric layers 120b, 220b, and 320b are made of HfO$_2$ or ZrO$_2$, the materials mentioned in Table 1 can be used as the metal source (M). H$_2$O, O$_3$, an O radical, alcohol (for example, isopropyl alcohol), D$_2$O, and H$_2$O$_2$ can be used as the oxygen source (O).

Next, the dielectric layers 120, 220, and 320 are heat-treated in step S4. The dielectric layers 120, 220, and 320 become dense, and defects in the dielectric layers 120, 220, and 320 are reduced by the above heat treatment. The thermal process is preferably performed by only the above-described RTA process.

The RTA process may be performed at a temperature of about 600 to about 1,000° C. for about 30 seconds to about 60 seconds. Finally, the upper structures are formed in step S5.

The upper structures such as the gate electrode 130, the control gate 230, and the upper electrode 330 are formed on top of the dielectric layers 120, 220, and 320. If the dielectric layers according to some embodiments of the present invention are formed, the present invention has an advantage in that polysilicon, which is widely used in a conventional mass-production process, can be used to form the upper structures.

Figure 6:
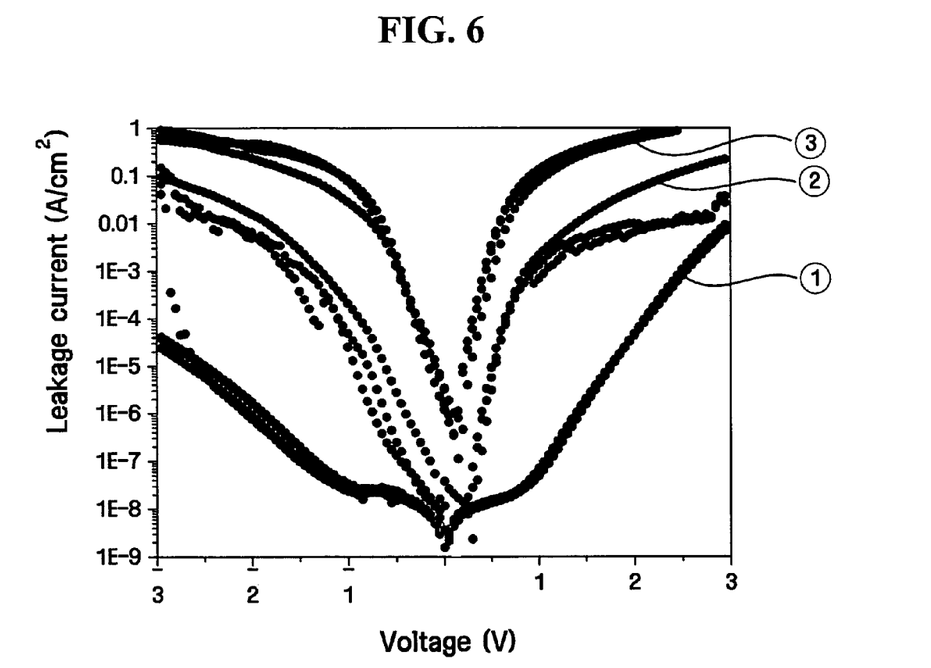
FIG. 6 is a graph showing leakage current characteristics of dielectric layers fabricated according to different fabricating methods.

After the dielectric layers according to some embodiments of the present invention are formed, a result of measuring a leakage current characteristic is shown in FIG. 6. In FIG. 6, a plot ① indicates a leakage current characteristic measured from a test sample having the dielectric layer fabricated according to one embodiment of the present invention. Graphs ② and ③ indicate leakage current characteristics measured from comparative samples.

The dielectric layer of the test sample which is used as a gate dielectric layer of a MOS transistor was prepared as follows. After an $HfO_2$ layer was formed to have a thickness of 15 Å using the ALD method, the RTN process was performed at a temperature of 750° C. for 60 seconds, and the RTO process was performed at a temperature of 950° C. for 30 seconds so that a lower dielectric layer was formed. Subsequently, an $HfO_2$ layer was formed to have a thickness of 15 Å so that an upper dielectric layer was formed. The RTA process was performed at a temperature of 950° C. for 30 seconds so that the dielectric layer was completed.

Meanwhile, the dielectric layer of the comparative sample of the graph ② was formed in the same manner as that of the test sample of the graph ①, except that an $HfO_2$ upper dielectric layer was formed to have a thickness of 25 Å.

A dielectric layer of the comparative sample of the graph ③ was prepared as follows. After a $HfO_2$ layer was formed to have a thickness of 30 Å using the ALD method, the RTN process was performed at a temperature of 750° C. for 60 seconds, the RTO process was performed at a temperature of 950° C. for 30 seconds, and the RTA process was performed at a temperature of 950° C. for 30 seconds so that the dielectric layer was formed.

While the test sample (the graph ①) had a very low leakage current of $7 \times 10^{-8}$ (A/cm$^2$) at a voltage of 1V, the comparative samples (the graphs ② and ③) respectively had very high leakage currents of 0.1 (A/cm$^2$) and 0.002 (A/cm$^2$) at a voltage of 1V. That is, if the dielectric layer is formed according to some embodiments of the present invention, the leakage current characteristic improves remarkably. While the comparative sample of the graph ③ had a capacitive equivalent thickness (CET) of 33.5 Å, the test sample of the graph ① had a CET of 28.5 Å. That is, although the CET of the test sample of the graph ① was thinner than that of the comparative sample of the graph ③, the test sample had the remarkably improved leakage current characteristics. Although applicants do not wish to be held to a particular theory, it is believed that that this is because the $HfO_2$ layer according to some embodiments of the present invention was prevented from crystallizing and maintain an amorphous state. Meanwhile, although the dielectric layer of the comparative sample of the graph ② was thicker than the test sample, the leakage current of the comparative sample of the graph ② was greatly larger than that of the test sample. It is also believed that this is because the $HfO_2$ upper layer of the comparative sample was formed to have a thickness that is above the critical crystallization thickness so that the $HfO_2$ upper layer crystallized rapidly.

As understood from the result shown in FIG. 6, after the $HfO_2$ lower layer with a thickness equal to or less than the critical crystallization thickness is formed according to some embodiments of the present invention, the $HfO_2$ lower layer is heat-treated and converted into a silicate layer. Then, the $HfO_2$ upper layer with a thickness equal to or less than the critical crystallization thickness is formed and finally treated with heat so that the dielectric layer is completed. It can be deduced that the leakage current characteristic of the dielectric layer thus formed can be improved remarkably.

Meanwhile, to measure the critical crystallization thickness, the thickness of the $HfO_2$ lower layer was fixed at 15 Å, the thickness of the HfO2 layer, which is the precursor layer of the upper dielectric layer, was changed to 15 Å, 18 Å, 20 Å, 22 Å, and 25 Å, and then the remaining processes were performed in the same manner as those of the above test sample, thereby measuring leakage currents of the fabricated samples. As a result, if the thickness of the $HfO_2$ layer was 20 Å or less, a leakage current of the $HfO_2$ layer was about $10^{-3}$ (A/cm$^2$) or less. Particularly, if the thickness of the $HfO_2$ layer was 15 Å or less, a leakage current of the $HfO_2$ layer was about $10^{-6}$ (A/cm$^2$) or less. On the other hand, if the thickness of the $HfO_2$ layer was 22 Å and 25 Å, a leakage current of the $HfO_2$ layer was high, i.e., about $10^{-2}$ (A/cm$^2$) or more. Thus, it can be deduced that the critical crystallization thickness is 20 Å.

As describe above, the dielectric multilayer structure according to some embodiments of the present invention may provide the following advantages.

Since the dielectric multilayer structure according to some embodiments of the present invention can be maintained an amorphous state, a leakage current characteristic of the dielectric multilayer structure can be improved.

Furthermore, since a lower dielectric layer is made of a silicate material, which can improve an interface characteristic without substantially reducing the EOT, and an upper dielectric layer is made of metal oxide or metal oxynitride having a dielectric constant larger than that of the lower dielectric layer, a dielectric constant of the dielectric layer can be maximized.

As a result, the leakage current characteristic and the dielectric constant of the dielectric layer can be improved simultaneously and a thick dielectric layer can be formed. Thus, the performance of a microelectronic device using the above dielectric layer can be improved.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for fabricating a semiconductor device comprising:
   forming a precursor layer including a metal oxide ($MO_y$) or metal oxynitride ($MO_yN_z$), over a lower structure containing silicon;
   heat-treating the precursor layer to convert the precursor layer into a lower dielectric layer comprising amorphous silicate ($M_{1-x}Si_xO_y$) or amorphous silicate nitride ($M_{1-x}Si_xO_yN_z$);
   forming an upper dielectric layer comprising amorphous metal oxide ($M'O_y$) or amorphous metal oxynitride ($M'O_yN_z$), over the lower dielectric layer; and after forming the upper dielectric layer, heat-treating the lower dielectric layer and the upper dielectric layer to form a dielectric multilayer structure with reduced defects wherein the dielectric multilayer stricture includes the lower dielectric layer and upper dielectric layer, the lower dielectric layer including amorphous silicate ($M_{1-x}Si_xO_y$) or amorphous silicate nitride ($M_{1-x}Si_xO_yN_z$), the upper dielectric layer including amorphous metal oxide ($M'O_y$) or amorphous metal oxynitride ($M'O_yN_z$).

2. The method of claim 1, wherein forming the precursor layer and forming the upper dielectric layer respectively include forming the precursor layer and the upper dielectric layer to have respective thicknesses that are equal to or less than respective critical crystallization thicknesses to prevent the lower dielectric layer and the upper dielectric layer from being crystallized during the heat treating of the precursor layer and the heat-treating of the lower dielectric layer and the upper dielectric layer.

3. The method of claim 2, wherein the critical crystallization thicknesses are respectively about 20 Å.

4. The method of claim 1, wherein heat-treating of the precursor layer and heat-treating the dielectric layer are performed at a temperature range of about 600 to about 1,000° C.

5. The method of claim 1, wherein heat-treating the precursor layer of the lower dielectric layer comprises a simple thermal process, a thermal nitridation process, a thermal oxidation process, or a combination thereof.

6. The method of claim 5, wherein the simple thermal process is performed in an inert gas atmosphere or in a vacuum.

7. The method of claim 5, wherein the thermal nitridation process is a direct plasma nitridation process, a remote plasma nitridation process, or a $NH_3$ plasma nitridation process.

8. The method of claim 5, wherein the thermal oxidation process is a dry oxidation process, an annealing process using $O_3$, an oxidation process using oxygen radicals, an oxidation process using $O_2$ plasma, a wet oxidation process using $H_2O$, a wet oxidation process using in-situ steam generation (ISSG), or a wet oxidation process using water vapor generation (WVG).

9. The method of claim 1, wherein heat treating the lower dielectric layer and the upper dielectric layer comprises a simple thermal process in an inert gas atmosphere or in a vacuum.

10. The method of claim 1, wherein heat-treating the precursor layer and heat-treating the lower dielectric layer and the upper dielectric layer comprise a rapid thermal process (RTP).

11. The method of claim 1, wherein the M and the M' include at least one of titanium (Ti), zirconium (Zr), hafnium (Hf), strontium (Sr), barium (Ba), scandium (Sc), yttrium (Y), lanthanum (La), tantalum (Ta), and aluminum (Al).

12. The method of claim 1, wherein the M and the M' are the same metal.

13. The method of claim 1, wherein the M and the M' are zirconium (Zr) or hafnium (Hf).

14. The method of claim 1, wherein a value of the (1−x) is about 0.1 to about 0.5.

15. The method of claim 1, before the forming of the precursor layer, further comprising removing a native oxide layer from the lower structure containing silicon.

* * * * *

UNITED STATES PATENT AND TRADEMARK OFFICE
CERTIFICATE OF CORRECTION

PATENT NO.       : 7,588,989 B2                                        Page 1 of 1
APPLICATION NO.  : 11/226053
DATED            : September 15, 2009
INVENTOR(S)      : Jong-Pyo Kim et al.

It is certified that error appears in the above-identified patent and that said Letters Patent is hereby corrected as shown below:

Column 11, line 4 claim 1, the word "stricture" should read --structure--.

Signed and Sealed this

Thirteenth Day of July, 2010

David J. Kappos
*Director of the United States Patent and Trademark Office*